United States Patent
Hsieh et al.

(10) Patent No.: US 8,462,520 B2
(45) Date of Patent: Jun. 11, 2013

(54) METAL SHIELDING CAN AND ASSEMBLY OF THE METAL SHIELDING CAN AND A CIRCUIT BOARD

(75) Inventors: Hao-Chun Hsieh, Hsichih (TW); Hsien-Min Chen, Hsichih (TW); Chia-Hsien Lee, Hsichih (TW)

(73) Assignee: Wistron Corporation, Taipei Hsien (TW)

( * ) Notice: Subject to any disclaimer, the term of this patent is extended or adjusted under 35 U.S.C. 154(b) by 119 days.

(21) Appl. No.: 12/816,618

(22) Filed: Jun. 16, 2010

(65) Prior Publication Data
US 2011/0141714 A1 Jun. 16, 2011

(30) Foreign Application Priority Data
Dec. 10, 2009 (TW) .............................. 98223151 U (51) Int. Cl.
*H05K 9/00* (2006.01)
(52) U.S. Cl.
USPC ............................ 361/818; 361/799; 361/816
(58) Field of Classification Search
USPC ................. 361/816, 818, 799, 800, 803, 760, 361/741; 174/351–358, 377–378
See application file for complete search history.

(56) References Cited

U.S. PATENT DOCUMENTS

| | | | | |
|---|---|---|---|---|
| 4,739,453 A | * | 4/1988 | Kurokawa | 361/816 |
| 4,861,941 A | * | 8/1989 | Kubo et al. | 174/350 |
| 5,847,938 A | * | 12/1998 | Gammon | 361/816 |
| 6,011,693 A | * | 1/2000 | Gore | 361/760 |
| 6,175,077 B1 | * | 1/2001 | Mendolia et al. | 174/384 |
| 6,192,577 B1 | * | 2/2001 | Larsson | 29/840 |
| 6,420,649 B1 | * | 7/2002 | Kahl et al. | 174/377 |
| 6,722,161 B2 | * | 4/2004 | LeBlanc | 65/134.4 |
| 6,781,851 B2 | * | 8/2004 | Daoud et al. | 361/818 |

* cited by examiner

*Primary Examiner* — Hung S Bui
(74) *Attorney, Agent, or Firm* — Steptoe & Johnson LLP (57) ABSTRACT

A metal shielding can includes a top wall and a surrounding wall. The surrounding wall extends downwardly from a periphery of the top wall, and includes a bottom surface and a groove formed in the bottom surface for receiving a tin solder element. The strength of the tin solder element to bond the metal shielding can to a circuit board can thus be enhanced so that the metal shielding can can be secured firmly on the circuit board. Moreover, the tin solder element can be positioned accurately relative to a solder pad of the circuit board, so that the post-soldering precision is easy to control and there is no solder overflow or adverse effect on an electronic component mounted on the circuit board. Thus, rework yield can be enhanced considerably to reduce manufacturing costs.

6 Claims, 9 Drawing Sheets

METAL SHIELDING CAN AND ASSEMBLY OF THE METAL SHIELDING CAN AND A CIRCUIT BOARD

CROSS-REFERENCE TO RELATED APPLICATION

This application claims priority of Taiwanese Application No. 098223151, filed on Dec. 10, 2009.

BACKGROUND OF THE INVENTION

1. Field of the Invention

The invention relates to a metal shielding can, more particularly to a metal shielding can for shielding electromagnetic waves generated during operation of an electronic component, and an assembly of the metal shielding can and a circuit board.

2. Description of the Related Art

Figure 1:
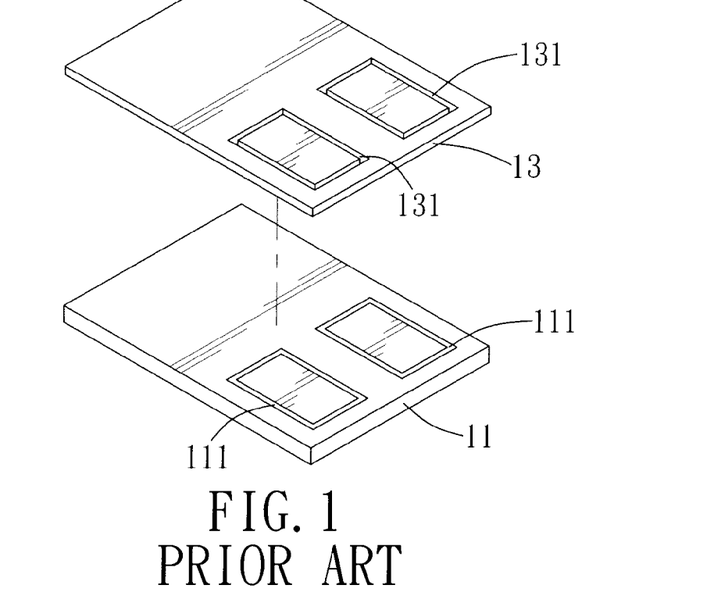
FIG. 1 is an exploded perspective view of a circuit board and a steel plate of the prior art.
Figure 2:
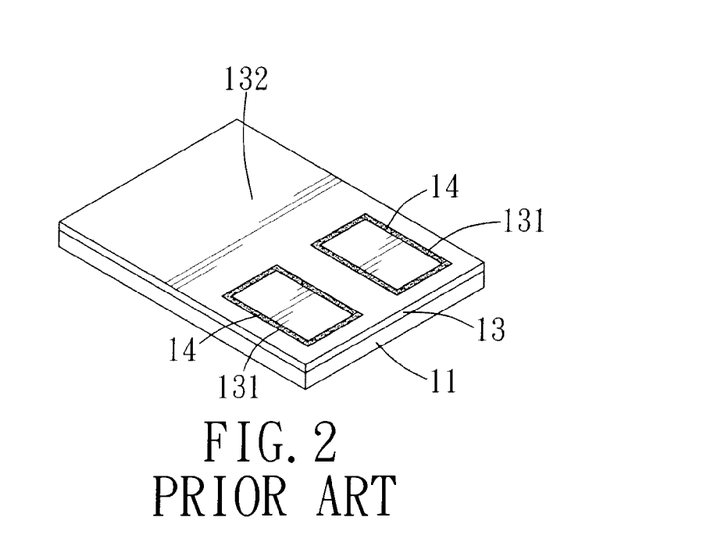
FIG. 2 is a perspective view of the conventional steel plate placed on the circuit board, showing a tin paste filling loop-shaped passages in the steel plate.
Figure 3:
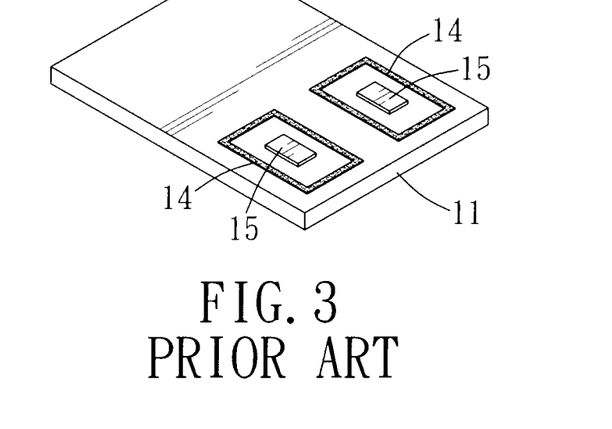
FIG. 3 is a perspective view showing electronic components each mounted within an area confined by the tin paste transferred to the circuit board.
Figure 4:
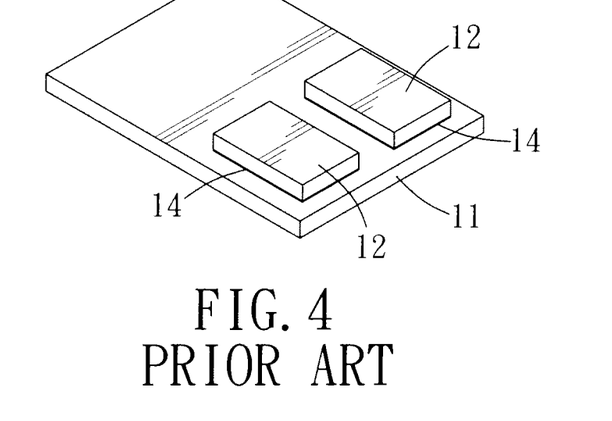
FIG. 4 is a perspective view showing a conventional metal shielding can soldered to the circuit board.

Referring to FIGS. 1 and 2, to solder metal shielding cans 12 (see FIG. 4) onto a circuit board 11 of a handheld electronic device, such as a mobile phone, a personal digital assistant, etc., a steel plate 13 is generally placed and positioned on the circuit board 11. Since the steel plate 13 is provided with loop-shaped passages 131, when a coating mechanism (not shown) applies a tin paste 14 onto a top face 132 of the steel plate 13, the tin paste 14 will fill the loop-shaped passages 131 and will be transferred onto solder pads 111 of the circuit board 11. Subsequently, referring to FIGS. 3 and 4, the steel plate 13 is removed from the circuit board 11 to permit mounting of electronic components 15 respectively on the circuit board 11 in areas confined by the tin pastes 14. Finally, the metal shielding cans 12 are respectively placed over the electronic components 15 on the circuit board 11 at the positions of the tin pastes 14, and the circuit board 11 is transported to a reflow furnace for solder reflow to enable the metal shielding cans 12 to be soldered to the circuit board 11.

Figure 5:
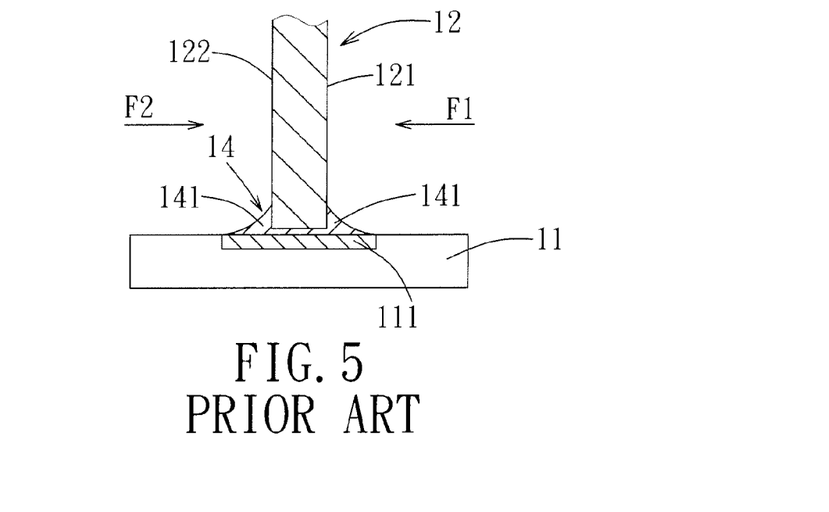
FIG. 5 is a fragmentary sectional view showing the metal shielding can soldered to the circuit board.

To conduct repairs or replacement of a damaged electronic component 15, the corresponding metal shielding can 12 must first be removed from the circuit board 11 using a rework machine so as to allow a subsequent repair or replacement operation to be performed. After the repair or replacement operation, the corresponding metal shielding can 12 needs to be re-soldered to the circuit board 11. Since there are many other electronic components 15 already mounted on the circuit board 11, transfer of the tin paste 14 using the steel plate 13 is no longer feasible, and it requires an operator to apply the tin paste 14 to the circuit board 11 manually. However, it is not easy to control the precision of the position of the applied tin paste 14 as well as the amount of the tin paste 14, which may result in the problem of solder overflow after the metal shielding can 12 is placed on the circuit board 11 at the position of the tin paste 14, and may even have an adverse effect on the electronic component 15. Furthermore, referring to FIG. 5, after the tinpaste 14 has solidified, a barrier portion 141 is formed at each of inner and outer side surfaces 121, 122 of the metal shielding can 12 so that, when the metal shielding can 12 is subjected to an external force (F1) or (F2) (i.e., a shear force) acting in a horizontal direction, the force (F1) or (F2) can be countered by the barrier portions 141 so as to prevent disengagement of the metal shielding can 12 from the respective solder pad 111. However, the provision of only the barrier portions 141 at the inner and outer side surfaces 121, 122 may still result in loosening of the metal shielding can 12 after long-term use.

On the other hand, a metal shielding can disclosed in Chinese Patent No. ZL200420090137.2 includes a conductive case and a conductive cover plate assembled to the conductive case. The disclosed metal shielding can is relatively costly to manufacture, and is primarily provided to overcome problems of leakage of electromagnetic waves between the conductive case and the conductive cover plate.

SUMMARY OF THE INVENTION

A primary object of the present invention is to provide a metal shielding can that can be soldered to a circuit board with facility and accuracy during reworking and that can be manufactured at relatively low costs.

Another object of the present invention is to provide an assembly of a metal shielding can and a circuit board, in which the metal shielding can can be soldered firmly to the circuit board.

The objects of this invention and solutions to the technical problems associated with the prior art are realized using the following technical means. The metal shielding can according to the present invention is disposed to receive a tin solder element, and includes a top wall and a surrounding wall.

The surrounding wall extends downwardly from a periphery of the top wall, and includes a bottom surface, and a groove formed in the bottom surface for receiving the tin solder element.

The objects of the present invention and the solutions to the technical problems associated with the prior art may be further realized by adopting the following technical means.

The groove has a loop shape and a downward opening, and is defined by the surrounding wall. The tin solder element is a tin wire that projects partially through the opening. The opening has a width smaller than a diameter of the tin wire such that the tin wire can be fitted within the groove and such that the tin wire is prevented from slipping out through the opening.

The surrounding wall further includes a mounting hole in spatial communication with the groove for insertion of the tin wire therethrough, thereby facilitating installation of the tin wire in the groove by an operator.

The metal shielding can of the present invention is disposed to receive a plurality of tin solder elements. The metal shielding can includes a top wall and a surrounding wall. The surrounding wall extends downwardly from a periphery of the top wall, and includes a bottom surface, and a plurality of grooves formed in the bottom surface for receiving the tin solder elements, respectively.

The grooves are configured to be discontinuous with respect to one another, and are angularly displaced from one another in a loop formation. Each of the grooves has a downward opening and is defined by the surrounding wall. Each of the tin solder elements is a tin wire that projects partially through the opening of a respective one of the grooves. The surrounding wall further includes a plurality of mounting holes, each of which is in spatial communication with a respective one of the grooves for insertion of one of the tin solder elements therethrough.

An assembly of the present invention includes a circuit board, a metal shielding can, and a tin solder element. The metal shielding can includes a top wall and a surrounding wall. The surrounding wall extends downwardly from a periphery of the top wall. The surrounding wall includes an inner side surface, an outer side surface, a bottom surface, and at least one groove formed in the bottom surface. The tin solder element is received partially within the groove to permit the inner side surface, the outer side surface, and the bottom surface to be soldered to the circuit board.

The advantages and effects of the metal shielding can of the present invention reside in that, by providing the groove in the bottom surface of the surrounding wall for receiving the tin solder element, the strength of the tin solder element to bond the metal shielding can to the solder pad can be enhanced so that the metal shielding can can be secured more firmly on the circuit board. Furthermore, during reworking, the tin solder element can be accurately positioned relative to the solder pad of the circuit board, so that the post-soldering precision is easy to control, no solder overflow will occur, and there is no adverse effect on the electronic component, whereby reworking yield can be enhanced and manufacturing costs can be reduced.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Through a description of the preferred embodiments, the technical means employed by the present invention to achieve the intended objects, and the advantageous effects contemplated thereby, can be better understood and appreciated. It is noted that the accompanying drawings are for illustration and reference only, and are not intended to limit the scope of the present invention.

Figure 6:
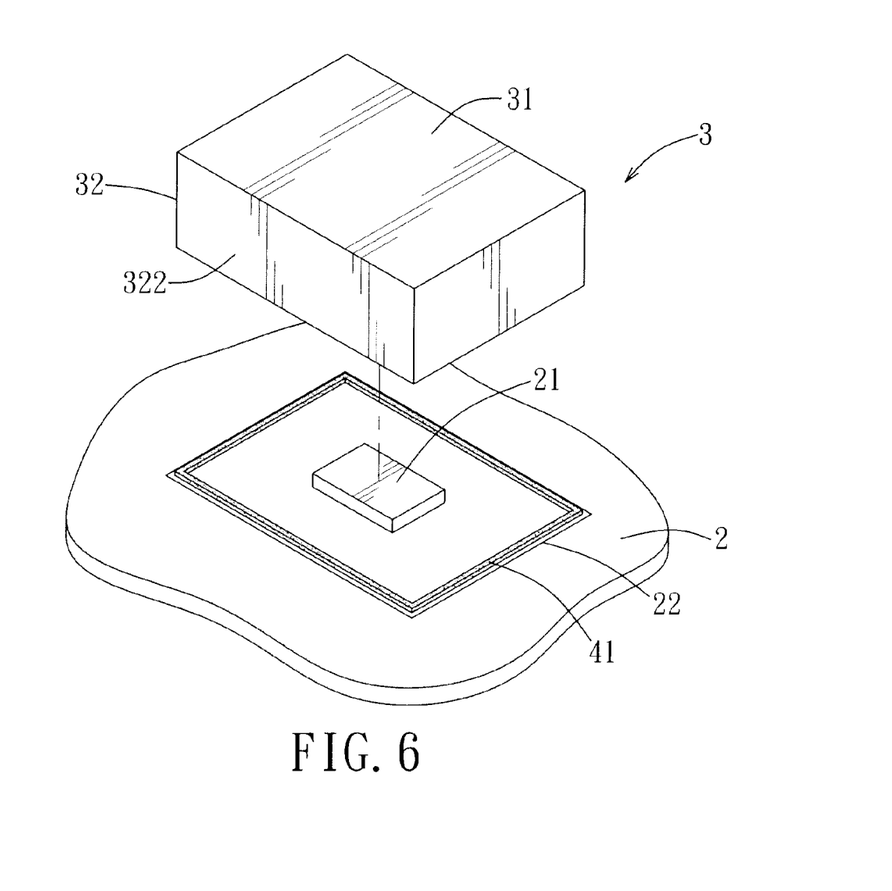
FIG. 6 is an exploded perspective view of the first preferred embodiment of a metal shielding can according to the present invention and a circuit board.

Referring to FIG. 6, the first preferred embodiment of a metal shielding can 3 according to the present invention is to be soldered to a circuit board 2 so as to shield electromagnetic waves generated by an electronic component 21 on the circuit board 2 during operation.

Figure 7:
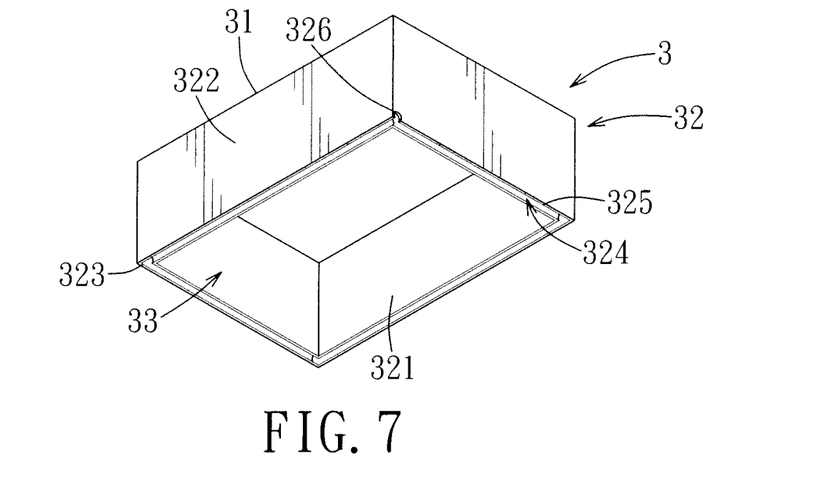
FIG. 7 is a perspective view of the first preferred embodiment of the metal shielding can according to the present invention.

Referring to FIGS. 6 and 7, the metal shielding can 3 includes a top wall 31 and a surrounding wall 32 extending downwardly from a periphery of the top wall 31. The top wall 31 and the surrounding wall 32 cooperatively define a covering space 33 to house the electronic component 21. The surrounding wall 32 includes an inner side surface 321, an outer side surface 322, and a bottom surface 323 interconnecting the inner and outer side surfaces 321, 322. The bottom surface 323 of the surrounding wall 32 is formed with a groove 324 in a shape of a loop and having a downward opening 325. The surrounding wall 32 defines the groove 324, which is disposed to receive a tin solder element 41.

Figure 8:
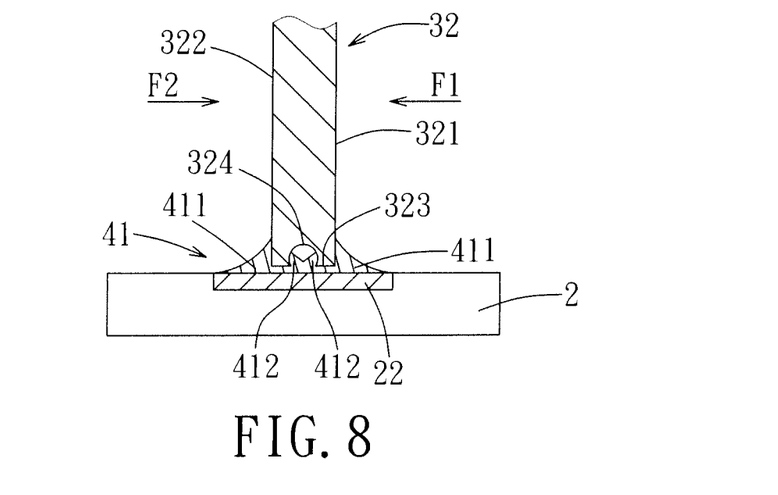
FIG. 8 is a fragmentary sectional view of the first preferred embodiment of the metal shielding can according to the present invention when soldered to the circuit board.

Referring to FIGS. 6, 7 and 8, during the process of soldering the metal shielding can 3 to the circuit board 2, a steel plate (not shown) such as that described in connection with the related prior art hereinbefore is used to transfer the tin solder element 41, which is in the form of a tin paste, to a solder pad 22 on a top face of the circuit board 2, and the electronic component 21 is subsequently mounted on the circuit board 2. Thereafter, the metal shielding can 3 is placed and positioned on the tin solder element 41 to permit a subsequent solder reflow operation to be conducted. Since the bottom surface 323 of the surrounding wall 32 is provided with the groove 324, when the metal shielding can 3 is placed on the tin solder element 41, a portion of the tin solder element 41 will enter the groove 324. When the tin solder element 41 has solidified after a reflow operation, the inner side surface 321, the outer side surface 322, and the bottom surface 323 of the surrounding wall 32 of the metal shielding can 3 are properly soldered to the solder pad 22 of the circuit board 2. At this time, the tin solder element 41 thus solidified has two outer barrier port ions 411 formed respectively at the inner and outer side surfaces 321, 322, and two inner barrier portions 412 formed within the groove 324 at positions opposite to the two outer barrier portions 411, respectively. Therefore, when the metal shielding can 3 is subjected to an external force (F1) (i.e., a shear force) or an external force (F2) (i.e., a shear force) acting in a horizontal direction, the external force (F1) or (F2) can be countered by the outer and inner barrier portions 411, 412, thereby preventing disengagement of the metal shielding can 3 from the solder pad 22. Thus, the strength of the tin solder element 41 to bond the metal shielding can 3 to the solder pad 22 can be enhanced, so that the metal shielding can 3 can be secured more firmly on the circuit board 2.

It is particularly noted that the formation of two inner barrier portions 412 (see FIG. 8) within the groove 324 of the surrounding wall 32 after solidification of the tin solder element 41 is only an example to illustrate the present invention. In practice, the tin solder element 41 may fill the groove 324 after solidification so that only one inner barrier portion 412 is formed. This can likewise achieve the effect of enhancing the bonding strength. Accordingly, the present invention should not be limited to the formation of two inner barrier portions 412 within the groove 324 as disclosed in this embodiment.

In case the electronic component 21 on the circuit board 2 is damaged and needs repair or replacement, a rework machine (not shown) is used to melt the tin solder element 41 so that the metal shielding can 3 can be removed from the circuit board 2, and a subsequent repair or replacement operation with respect to the electronic component 21 can be conducted.

Figure 9:
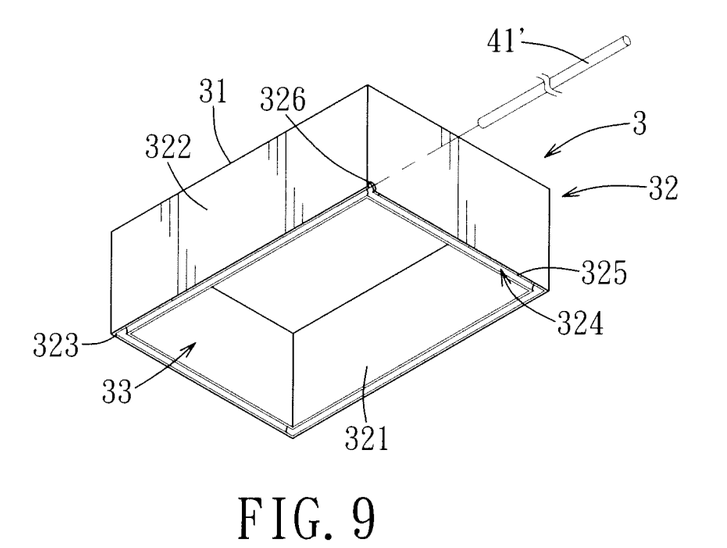
FIG. 9 is another perspective view of the first preferred embodiment of the metal shielding can according to the present invention, illustrating the assembly relationship between a surrounding wall of the metal shielding can and a tin solder element.
Figure 10:
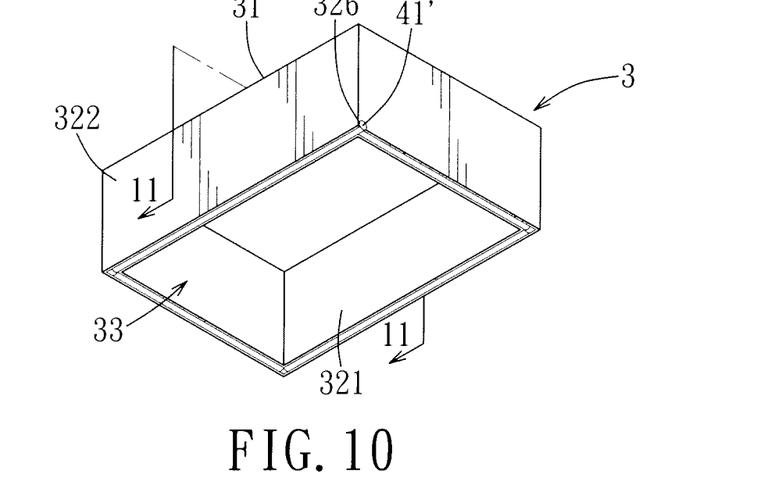
FIG. 10 is still another perspective view of the first preferred embodiment of the metal shielding can according to the present invention, illustrating how the tin solder element is fitted within a groove in the surrounding wall.
Figure 11:
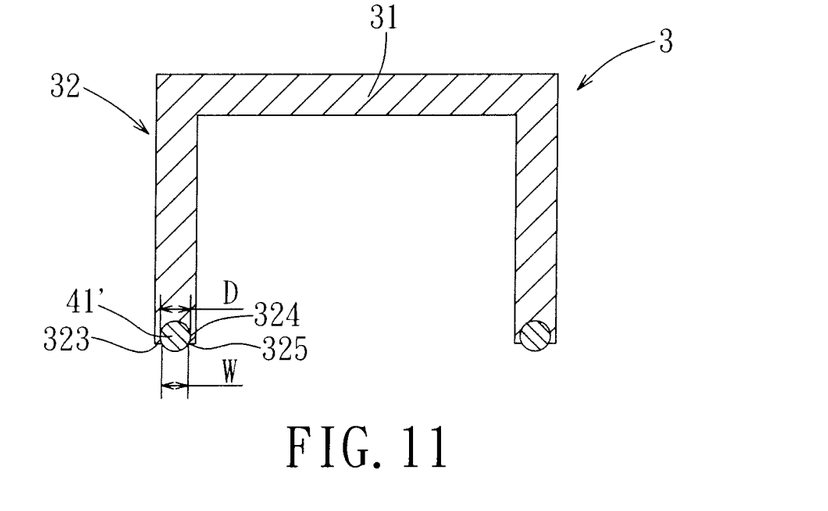
FIG. 11 is a sectional view taken along line 11-11 of FIG. 10.

Referring to FIGS. 9, 10 and 11, after repairing or replacing the electronic component 21 (see FIG. 6), it is necessary to re-solder the metal shielding can 3 to the circuit board 2. The manner the metal shielding can 3 is re-soldered to the circuit board 2 will be described hereinbelow.

The surrounding wall 32 further includes a mounting hole 326 disposed in the outer side surface 322 and in spatial communication with the groove 324. The mounting hole 326 is disposed to permit insertion of a tin solder element 41' in the form of a tin wire therethrough. The operator can easily insert one end of the tin solder element 41' into the groove 324 through the mounting hole 326 so as to fill the groove 324 with the tin solder element 41'. The opening 325 of the groove 324 has a width (W) which is smaller than a diameter (D) of the tin solder element 41' so that the tin solder element 41' can fit within the groove 324 after being inserted into the groove 324 and will not slip out through the opening 325. Moreover, a bottom end portion of the tin solder element 41' will protrude from the opening 325 and will be spaced apart from the bottom surface 323 of the surrounding wall 32 by a certain distance.

Figure 12:
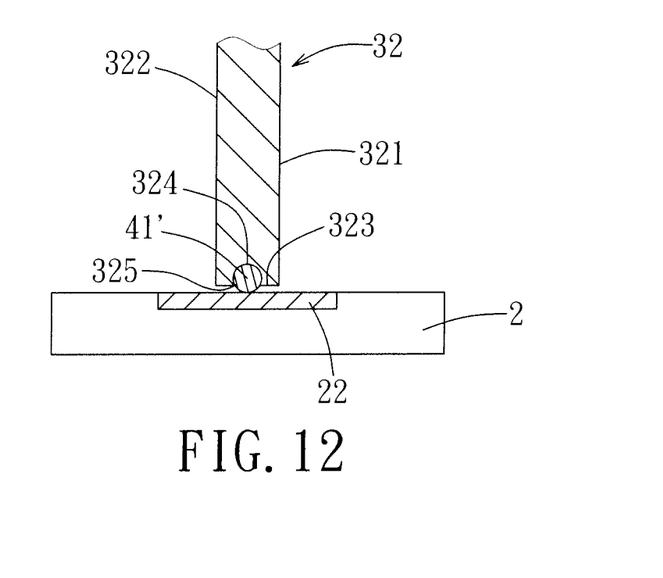
FIG. 12 is another fragmentary sectional view of the first preferred embodiment of the metal shielding can according to the present invention, illustrating the tin solder element disposed on the solder pad of the circuit board.
Figure 13:
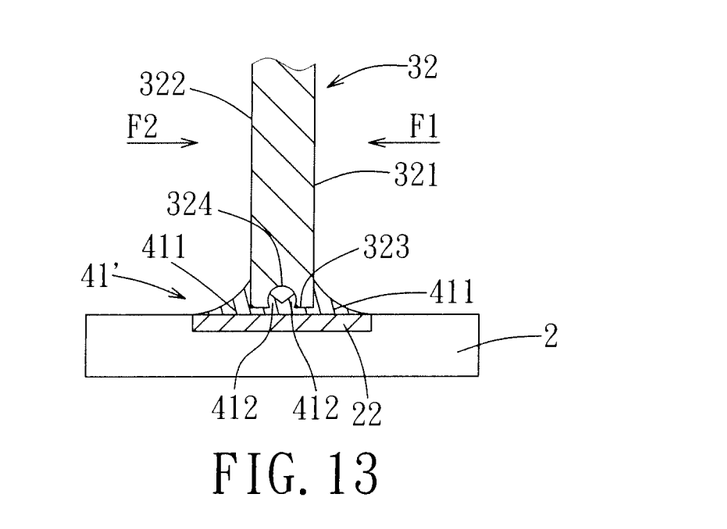
FIG. 13 is yet another fragmentary sectional view of the first preferred embodiment of the metal shielding can according to the present invention when soldered to the circuit board.

Referring to FIGS. 12 and 13, the metal shielding can 3 is thereafter placed on the circuit board 2, the tin solder element 41' is caused to abut against the solder pad 22, and the circuit board 2 together with the metal shielding can 3 is transported into a reflow furnace for solder reflow. During the reflow process, the tin solder element 41' will be melted and will flow outward through a clearance between the bottom surface 323 of the surrounding wall 32 and the solder pad 22 so that, after the tin solder element 41' has solidified, two outer barrier portions 411 are respectively formed at the inner and outer side surfaces 321, 322 and two inner barrier portions 412 are formed within the groove 324 at positions opposite to the two outer barrier portions 411, respectively, as shown in FIG. 13, so as to solder the inner side surface 321, the outer side surface 322, and the bottom surface 323 of the surrounding wall 32 of the metal shielding can 3 to the solder pad 22 of the circuit board 2. In addition, when the metal shielding can 3 is subjected to the horizontal external force (F1) or (F2), the metal shielding can 3 can counter the external force (F1) or (F2) through the outer barrier portions 411 and the inner barrier portions 412. Thus, the strength of the tin solder element 41' to bond the metal shielding can 3 to the solder pad 22 can be enhanced. Since re-soldering of the metal shielding can 3 to the circuit board 2 in this embodiment does not require manual application of tin paste, compared with the prior art, the tin solder element 41' can be positioned accurately relative to the solder pad 22 of the circuit board 2, so that post-soldering precision can be easily controlled and overflowing of tin solder will not occur. Nor will there be any adverse effect on the electronic component 21. Therefore, rework yield can be significantly enhanced to reduce manufacturing costs.

Figure 14:
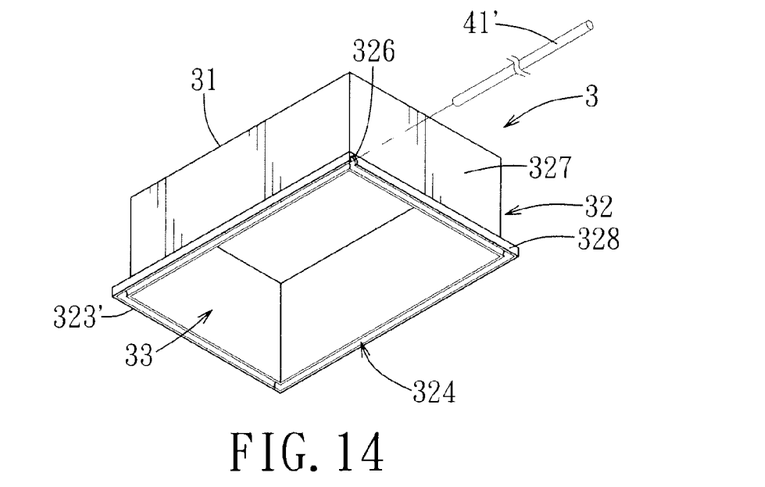
FIG. 14 is a perspective view of the first preferred embodiment of the metal shielding can according to the present invention in a modified form and a tin solder element.

It is noted that, in design, the surrounding wall 32 may include a surrounding wall portion 327 extending downwardly from the periphery of the top wall 31 and a loop-shaped protrusion 328 projecting from a bottom surface of the surrounding wall portion 327, as shown in FIG. 14, and the groove 324 may be formed in a bottom surface 323' of the loop-shaped protrusion 328.

Figure 15:
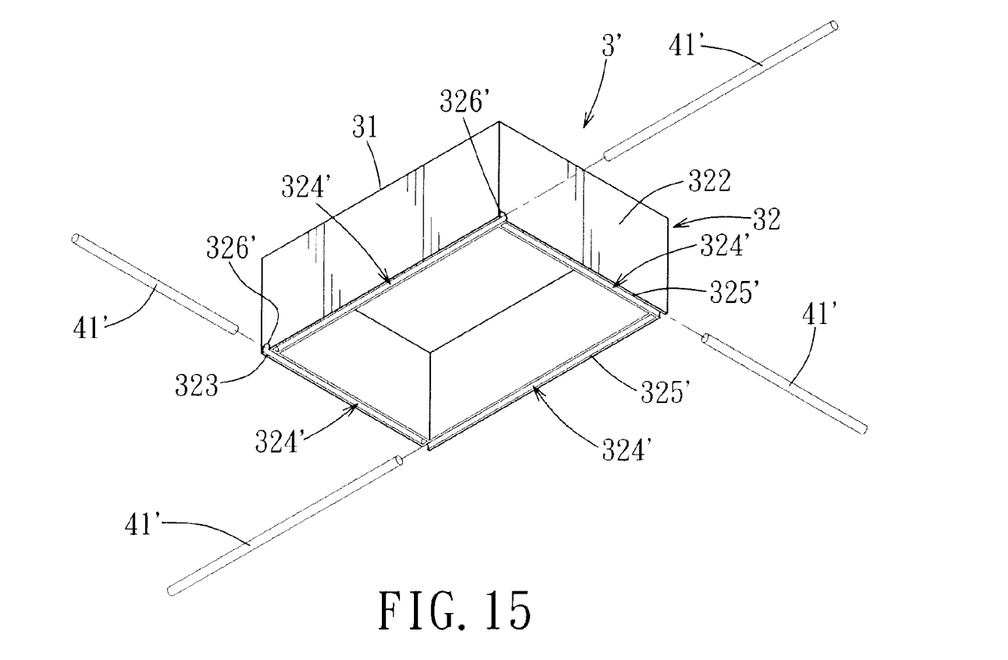
FIG. 15 is a perspective view of the second preferred embodiment of the metal shielding can according to the present invention, illustrating the assembly relationship between a surrounding wall of the metal shielding can and tin solder elements.
Figure 16:
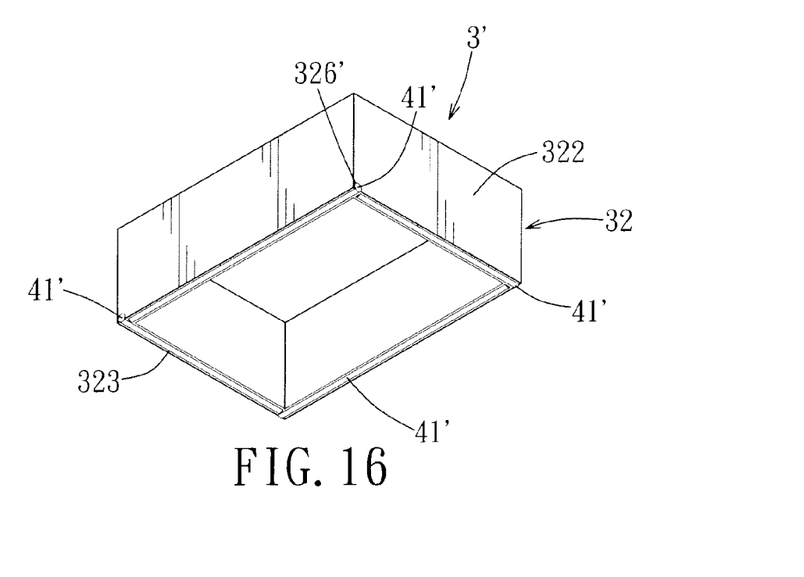
FIG. 16 is another perspective view of the second preferred embodiment of the metal shielding can according to the present invention, illustrating the tin solder elements fitted in grooves in the surrounding wall.

Referring to FIGS. 15 and 16, the second preferred embodiment of a metal shielding can 3' according to the present invention is substantially the same as the first preferred embodiment in overall construction and the manner of rework soldering. The difference resides in that the surrounding wall 32 includes a plurality of grooves 324' formed in the bottom surface 323 and each having a downward opening 325', and that the surrounding wall 32 further includes a plurality of mounting holes 326' formed in the outer side surface 322 and in spatial communication with the grooves 324', respectively.

Figure 17:
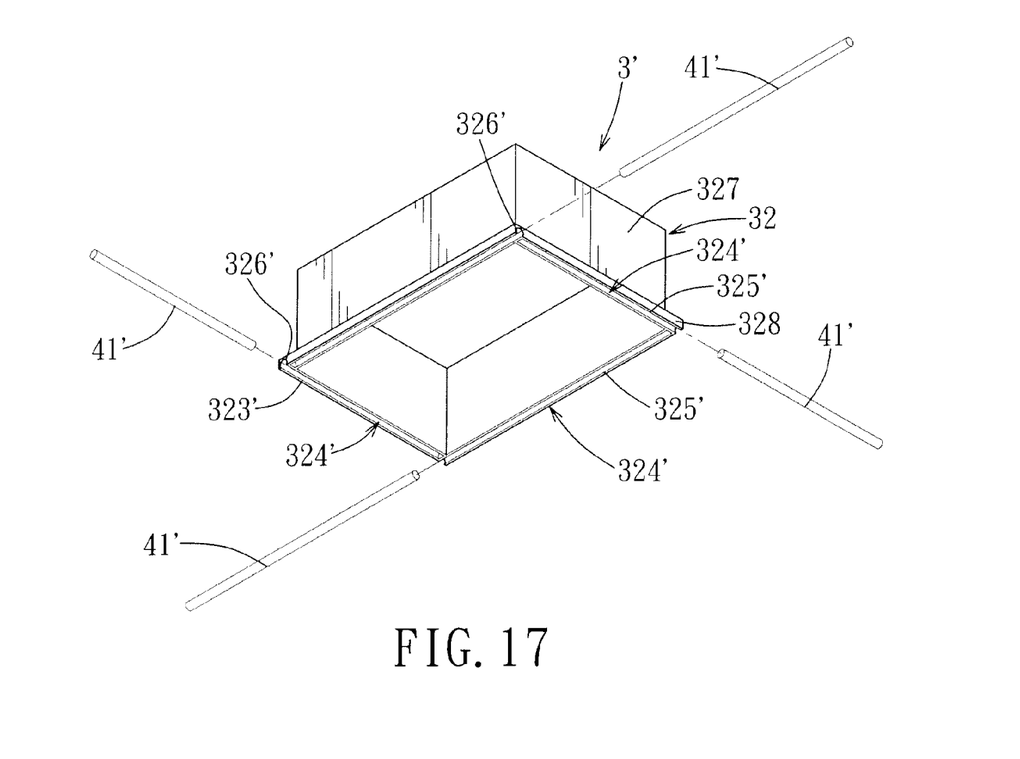
FIG. 17 is still another perspective view of the second preferred embodiment of the metal shielding can according to the present invention in a modified form.

The grooves 324' are configured to be discontinuous with respect to one another, and are angularly displaced from one another in a loop formation. The operator may insert one tin solder element 41' into each of the grooves 324' through the respective mounting hole 326', and the tin solder elements 41' can be likewise positioned accurately relative to the solder pad 22 of the circuit board 2 during reworking to enhance reworking yield and reduce manufacturing costs. In addition, in design, the surrounding wall 32 may include a surrounding wall portion 327 extending downwardly from the periphery of the top wall 31, and a loop-shaped protrusion 328 projecting from a bottom surface of the surrounding wall portion 327, and the grooves 324' are formed in a bottom surface 323' of the loop-shaped protrusion 328, as shown in FIG. 17.

In summary, in the metal shielding can 3, 3' in each of the above-described embodiments, by providing the groove (s) 324, 324' in the bottom surface 323, 323' of the surrounding wall 32 for receiving the tin solder element (s) 41, 41', the strength of the tin solder element (s) 41, 41' to bond the metal shielding can 3, 3' to the solder pad 22 can be enhanced so that the metal shielding can 3, 3' can be secured more firmly on the circuit board 2. Furthermore, during reworking, the tin solder element (s) 41, 41' can be accurately positioned relative to the solder pad 22 of the circuit board 2, so that the post-soldering precision is easy to control, no solder overflow will occur, and there is no adverse effect on the electronic component 21, whereby reworking yield can be enhanced and manufacturing costs can be reduced.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A metal shielding can for receiving a tin solder element, said metal shielding can comprising:

a top wall; and a surrounding wall extending downwardly from a periphery of said top wall, said surrounding wall including a bottom surface and a groove formed in said bottom surface for receiving the tin solder element, wherein said groove has a loop shape and a downward opening and is defined by said surrounding wall, the tin solder element being a tin wire that projects partially through said opening.

2. The metal shielding can of claim 1, wherein said opening has a width smaller than a diameter of the tin wire.

3. The metal shielding can of claim 2, wherein said surrounding wall further includes a mounting hole in spatial communication with said groove for insertion of the tin wire therethrough.

4. The metal shielding can of claim 1, wherein said surrounding wall further includes a mounting hole in spatial communication with said groove for insertion of the tin wire therethrough.

5. An electronic assembly comprising:

a circuit board;

a metal shielding can including a top wall, and a surrounding wall extending downwardly from a periphery of said top wall, said surrounding wall including an inner side surface, an outer side surface, a bottom surface, and at least one groove formed in said bottom surface; and a tin solder element received partially within said groove to permit said inner side surface, said outer side surface, and said bottom surface to be soldered to said circuit board, wherein said groove has a loop shape and a downward opening, and is defined by said surrounding wall.

6. An electronic assembly comprising: a circuit board;

a metal shielding can including a top wall, and a surrounding wall extending downwardly from a periphery of said top wall, said surrounding wall including an inner side surface, an outer side surface, a bottom surface, and at least one groove formed in said bottom surface; and tin solder element received partially within said groove to permit said inner side surface, said outer side surface, and said bottom surface to be soldered to said circuit board, wherein said surrounding wall includes a plurality of said grooves, which are formed in said bottom surface, said grooves being configured to be discontinuous with respect to one another and being angularly displaced from one another in a loop formation, each of said grooves having a downward opening and being defined by said surrounding wall.

* * * * *